US010915027B2

(12) United States Patent
Wang et al.

(10) Patent No.: US 10,915,027 B2
(45) Date of Patent: Feb. 9, 2021

(54) POST DEVELOPMENT TREATMENT METHOD AND MATERIAL FOR SHRINKING CRITICAL DIMENSION OF PHOTORESIST LAYER

(71) Applicant: Taiwan Semiconductor Manufacturing Co., Ltd., Hsin-Chu (TW)

(72) Inventors: Siao-Shan Wang, Hsin-Chu (TW); Ching-Yu Chang, Yilang County (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 47 days.

(21) Appl. No.: 16/048,455

(22) Filed: Jul. 30, 2018

(65) Prior Publication Data
US 2018/0335700 A1    Nov. 22, 2018

Related U.S. Application Data

(62) Division of application No. 15/010,443, filed on Jan. 29, 2016, now Pat. No. 10,036,957.

(51) Int. Cl.
*G03F 7/40* (2006.01)
*G03F 7/30* (2006.01)
*G03F 7/00* (2006.01)

(52) U.S. Cl.
CPC .............. *G03F 7/40* (2013.01); *G03F 7/0035* (2013.01); *G03F 7/30* (2013.01); *G03F 7/405* (2013.01)

(58) Field of Classification Search
CPC .................................. G03F 7/26; G03F 7/0035
See application file for complete search history.

(56) References Cited

U.S. PATENT DOCUMENTS

| | | | |
|---|---|---|---|
| 8,216,767 B2 | 7/2012 | Wang et al. | |
| 8,323,870 B2 | 12/2012 | Lee et al. | |
| 8,580,117 B2 | 11/2013 | Kao et al. | |
| 8,658,344 B2 | 2/2014 | Wang et al. | |
| 8,715,919 B2 | 5/2014 | Chang et al. | |
| 8,741,551 B2 | 6/2014 | Wu et al. | |
| 10,036,957 B2 * | 7/2018 | Wang | G03F 7/0035 |
| 2013/0122425 A1 | 5/2013 | Yoshida et al. | |
| 2013/0171825 A1 | 7/2013 | Xu | |
| 2013/0323641 A1 | 12/2013 | Chang | |
| 2014/0011133 A1 | 1/2014 | Liu et al. | |
| 2014/0017615 A1 | 1/2014 | Chang | |
| 2014/0017616 A1 | 1/2014 | Chang | |
| 2014/0065843 A1 | 3/2014 | Chang et al. | |
| 2014/0117563 A1 | 5/2014 | Yu et al. | |
| 2014/0120459 A1 | 5/2014 | Liu et al. | |
| 2014/0186773 A1 | 7/2014 | Chang | |
| 2014/0255850 A1 | 9/2014 | Chang et al. | |
| 2014/0272709 A1 | 9/2014 | Liu et al. | |
| 2014/0272726 A1 | 9/2014 | Chang | |
| 2014/0273521 A1 | 9/2014 | Wu et al. | |
| 2016/0033869 A1 | 2/2016 | Hustad et al. | |
| 2017/0219925 A1 | 8/2017 | Wang et al. | |

FOREIGN PATENT DOCUMENTS

| | | | |
|---|---|---|---|
| TW | 201318215 A | 5/2013 | |
| WO | WO 2009033837 A2 | 3/2009 | |

* cited by examiner

*Primary Examiner* — Kathleen Duda
(74) *Attorney, Agent, or Firm* — Haynes and Boone, LLP

(57) ABSTRACT

A lithography method is provided in accordance with some embodiments. The lithography method includes forming a patterned photoresist on a material layer, applying a first bonding material to a side surface of the patterned photoresist, performing a treatment on the first bonding material to bond the first bonding material to the side surface of the patterned photoresist, wherein the treatment creates a bonding site on the first bonding material configured to bond to a second bonding material, applying the second bonding material to a side surface of the first bonding material, and patterning the material layer by selectively processing a portion of the material layer exposed by the patterned photoresist, the first bonding material, and the second bonding material.

20 Claims, 7 Drawing Sheets

POST DEVELOPMENT TREATMENT METHOD AND MATERIAL FOR SHRINKING CRITICAL DIMENSION OF PHOTORESIST LAYER

PRIORITY

The present application is a divisional application of U.S. patent application Ser. No. 15/010,443, filed on Jan. 29, 2016, titled "Post Development Treatment Method and Material for Shrinking Critical Dimension of Photoresist Layer," the disclosure of which is incorporated herein in its entirety.

BACKGROUND

In integrated circuit (IC) fabrications, a patterned photoresist layer is used to transfer a designed pattern having small feature sizes from a photomask to a wafer. As resolution of patterns increases, it is desirable to shrink the critical dimension of photoresist patterns to create smaller feature sizes. However, there is currently a limit on how much the critical dimension of a photoresist pattern may be shrunk by post development treatments.

Therefore, there is need for a post development treatment material and a lithography method to address the above issue.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
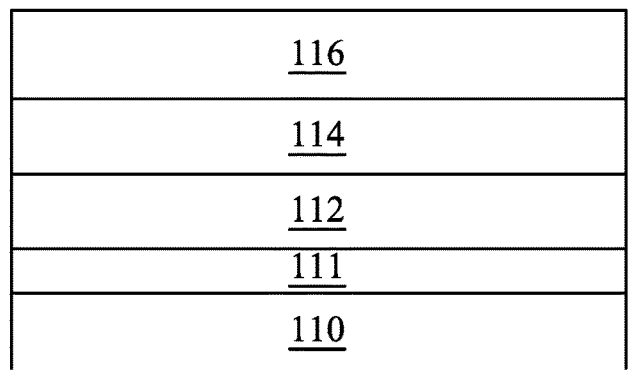
FIGS. 1 through 9 illustrate cross-sectional views of one exemplary semiconductor structure at various fabrication stages, constructed in accordance with some embodiments.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed interposing the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIGS. 1 through 9 provide cross-sectional views of a semiconductor structure 100 at various fabrication stages in accordance with some embodiments. The semiconductor structure 100 and various embodiments of method for making the same are collectively described with reference to FIGS. 1-14.

Figure 12:
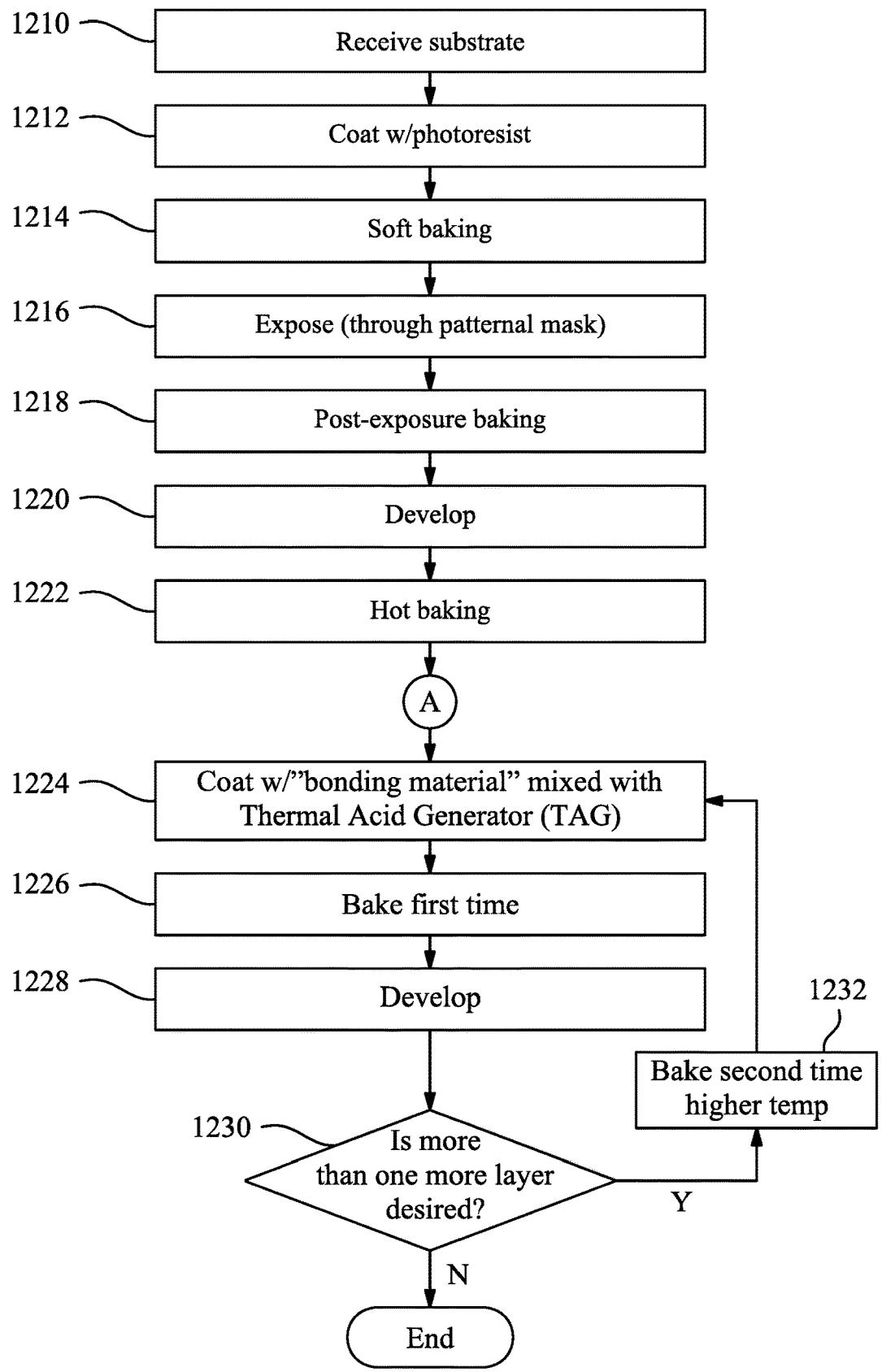
FIG. 12 is a flow diagram of a method of increasing thickness of patterned photoresist features, corresponding to FIGS. 1-6.

Referring first to FIG. 1 and to block 1210 of FIG. 12, the semiconductor structure 100 is a semiconductor wafer in the present embodiment. The semiconductor structure 100 includes a semiconductor substrate 110, such as a silicon substrate in some embodiments. Additionally or in the alternative, the substrate 110 may include another elementary semiconductor, such as germanium, or diamond in some embodiments. The substrate 110 may include a compound semiconductor, such as silicon carbide, gallium arsenic, indium arsenide, and indium phosphide. The substrate 110 may include an alloy semiconductor, such as silicon germanium, silicon germanium carbide, gallium arsenic phosphide, and gallium indium phosphide. The substrate 110 may include one or more epitaxial semiconductor layers, such as semiconductor layer(s) epitaxially grown on a silicon substrate. For example, the substrate may have an epitaxial layer overlying a bulk semiconductor. For example, the epitaxial layer may include semiconductor materials different from those of the bulk semiconductor such as a layer of silicon germanium overlying a bulk silicon, or a layer of silicon overlying a bulk silicon germanium formed by a process including selective epitaxial growth (SEG). Furthermore, the substrate 110 may include a semiconductor-on-insulator (SOI) structure. For examples, the substrate may include a buried oxide (BOX) layer formed by a process such as separation by implanted oxygen (SIMOX). In other embodiments, the substrate 110 may include a glass such as in thin film transistor (TFT) technologies. Further, the substrate may be strained for performance enhancement. The semiconductor substrate 110 may be received as shown in block 1210 of FIG. 12.

The semiconductor structure 100 may also include other material layers and other circuit patterns. For example, the semiconductor structure 100 includes various doped features, such as doped well structure (e.g., a P-typed doped well and an N-type doped well) formed in the semiconductor substrate 110. In other embodiments, multiple semiconductor material layers, such as gallium arsenic (GaAs) and aluminum gallium arsenic (AlGaAs), are epitaxially grown on the semiconductor substrate 110 and are patterned to form various devices, such as light-emitting diodes (LEDs). In some other embodiments, the semiconductor structure 100 includes fin active regions and three dimensional fin field-effect transistors (FinFETs) formed or to be formed thereon. In other embodiments, the semiconductor structure 100 may further include one or more material layers 111 to be patterned. Patterning includes changing the shape, a composition, crystalline structure, or any other suitable property of the material layer 111, and in various embodiments the material layer 111 includes a dielectric layer to be patterned to form trenches for conductive lines, contacts, or vias; a gate material stack to be patterned to form gates; a semiconductor material to be patterned by implantation to form source/drain regions; and/or a semiconductor material to be patterned to form isolation trenches.

A photoresist material is used to define those portions of the material layer 111 to be processed in order to pattern it. Still referring to FIG. 1, an exemplary tri-layer photoresist is formed on the semiconductor substrate 110. The tri-layer photoresist includes an under layer 112 formed on the material layer 111 to be patterned. The under layer 112 is configured to provide resistance to the patterning technique (e.g., etching resistance, ion implantation resistance, etc.). The under layer 112 functions as a mask to protect underlying portions of the material layer 111. Accordingly, the under layer 112 has a sufficient thickness to achieve this. In some embodiments, the under layer 112 includes an organic polymer free of silicon. In some embodiments, the formation of the under layer 112 includes spin-on coating and curing (such as a thermal baking process with a proper baking temperature).

The exemplary tri-layer photoresist also includes a middle layer 114 is formed on the under layer 112. The middle layer 114 may include a silicon-containing material layer configured to provide etch selectivity from the under layer 112. In some embodiments, the middle layer 114 functions an etch mask to transfer a pattern to the under layer 112. In some embodiments, the middle layer 114 is also designed to function as a bottom anti-reflective coating that reduces reflection during a lithography exposure process, thereby increasing the imaging contrast and enhancing the imaging resolution. In some embodiments, the formation of the middle layer 114 includes spin-on coating and curing (such as a thermal baking process with a suitable baking temperature).

Referring now to blocks 1212-1220 of FIG. 12 and to FIG. 1, the third layer of the tri-layer photoresist layer, the photosensitive layer or resist layer 116, is formed on the middle layer 114. The formation of the photosensitive layer 116 may include a spin-on coating process as shown in block 1212, a baking process as shown in block 1214, and a developing process as shown in block 1220. The photosensitive layer 116 may include a photosensitive chemical, a polymeric material and a solvent. In some embodiments, the photosensitive layer 116 utilizes a chemical amplification (CA) resist material. For example, a positive CA, or positive tone, resist material includes a polymer material that turns soluble to a developer such as a base solution after the polymeric material is reacted with acid. Alternatively, the CA resist material can be negative, or negative tone, and include a polymer material that turns insoluble to a developer such as a base solution after the polymer is reacted with acid. The photosensitive layer 116 further includes a solvent. The solvent may be partially evaporated by a soft baking process as shown in block 1214. In furtherance of the embodiments when the CA resist material is used, the photosensitive chemical includes photo-acid generator (PAG) distributed in the photosensitive layer. When absorbing photo energy, the PAG decomposes and forms a small amount of acid. The PAG may have a concentration ranging between about 1% and 30% weight of the photosensitive layer 116.

Figure 2:
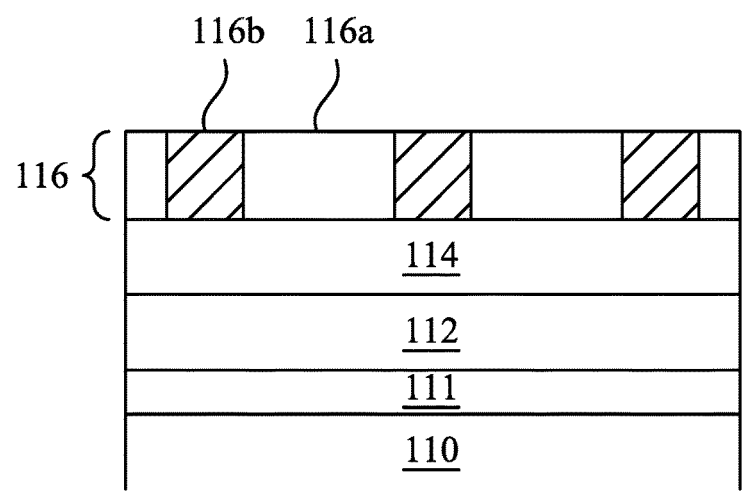

Referring to block 1216 of FIG. 12 and to FIG. 2, the semiconductor structure 100 is then transferred to a lithography apparatus for an exposing process. In one embodiment, the exposing process utilizes a photolithographic technique with a proper radiation source and corresponding radiation energy. In various examples, the radiation energy may include a 248 nm beam by Krypton Fluoride (KrF) excimer lasers, a 193 nm beam by Argon Fluoride (ArF) excimer lasers, a 157 nm beam by Fluoride (F2) Excimer Lasers, or Extreme ultra-violet (EUV) light, such as EUV light with wavelength at about 13.5 nm. In the exposing process, the photosensitive layer 116 is exposed to radiation energy using a photomask (mask or reticle) having a pre-defined pattern, resulting in a latent photoresist pattern that includes a plurality of exposed regions such as exposed features 116a and a plurality of unexposed regions 116b. After the exposing process, other processing steps, such as a post-exposure-baking (PEB) process are performed, as shown in block 1218 of FIG. 12.

Figure 3:
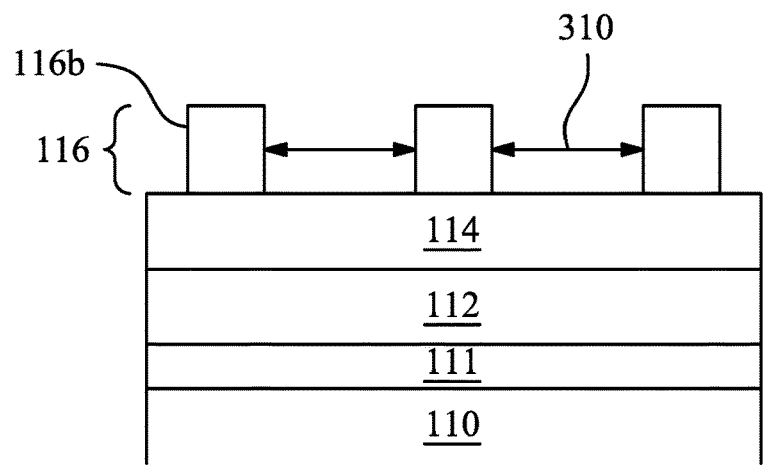

Referring to block 1220 of FIG. 12 and to FIG. 3, the photosensitive layer 116 is developed by a developer to form a patterned photoresist layer. In the present example, the photosensitive layer 116 is positive-tone, and the exposed portions 116a of the photoresist layer are removed by a developer, such as tetramethyl ammonium hydroxide (TMAH). In one example, the developer includes a TMAH solution with a proper concentration, such as about 2.38%. A negative-tone photosensitive layer and negative-tone developer may be alternatively used. The remaining features 116b of the patterned photosensitive layer 116 are spaced apart by a distance 310, which may correspond to the critical dimension of the semiconductor device. After the developing, the photosensitive layer 116 may proceed to other processing steps, such as a hard-baking process. The exposing process using the photomask and the photolithography apparatus may be implemented or replaced by other proper techniques such as maskless photolithography, electron-beam writing, ion-beam writing, and molecular imprint.

Figure 4:
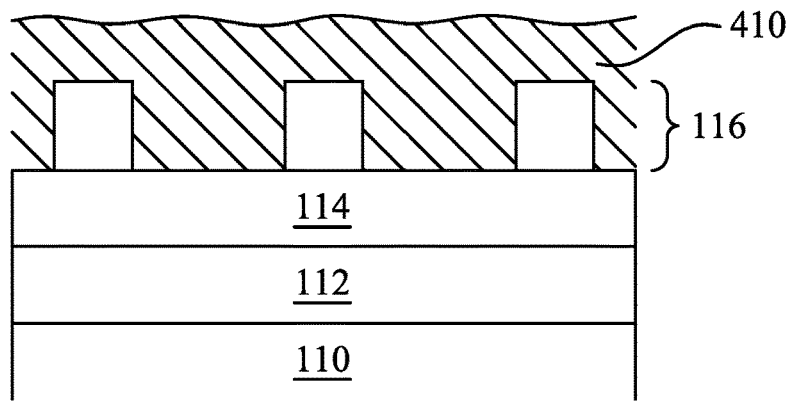
Figure 10:
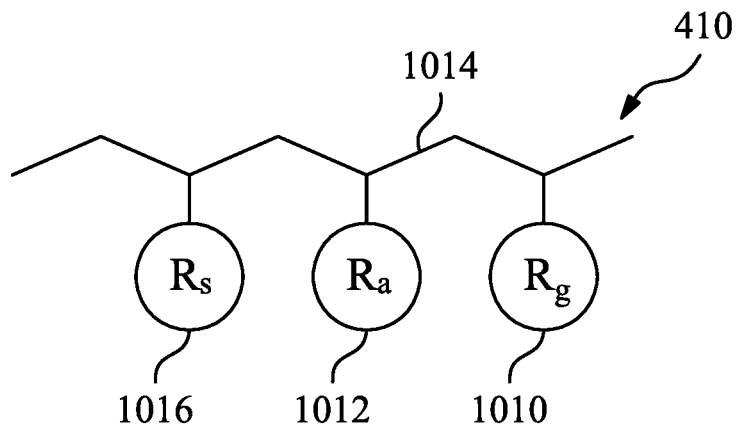
FIGS. 10 and 11 are diagrammatical views of a chemical structure of a bonding material used in a photolithography process, constructed according to aspects of the present disclosure.

Referring to block 1224 of FIG. 12 and to FIG. 4, the patterned photosensitive layer 116 is coated with a bonding material 410, further described in FIG. 10. The bonding material 410 may be applied to the photosensitive layer 116 using any suitable technique, and in some embodiments, the bonding material 410 is applied via a spin-on coating and curing process.

Referring now to FIG. 10, an exemplary chemical structure of a class of materials suitable for use as the bonding material 410 is illustrated. The bonding material 410 includes one or more of: a grafting monomer ($R_g$) 1010, an acid-switchable monomer ($R_a$) 1012, and/or an organic-soluble monomer ($R_s$) each bonded to a chemical backbone 1014.

The grafting monomer ($R_g$) 1010 can be a basicity monomer with a logarithmic acid dissociation constant (pKa) larger than 7. In preferred embodiments the grafting monomer 1010 is comprised of ammonia, primary amine, secondary amine, tertiary amine, amide, hydroxide, NCS— (N-chlorosuccinimide), alkenyl, phenol, or cyanide. However, it is understood that other basicity monomers may be used. The grafting monomer ($R_g$) 1010 reacts with acid to bond the bonding material to the photoresist material.

The acid-switchable monomer ($R_a$) 1012 comprises an acid-labile group, e.g. a protective group, and is catalyzed by acid. As a protective group, the acid-switchable monomer 1012 prevents the grafting monomer 1010 from reacting with acid and photoresist material. When baked at a high temperature, for example above 80 degrees Celsius, the acid-switchable monomer 1012 de-protects. When the acid-switchable monomer 1012 de-protects, it becomes a reactive site for grafting monomer 1010.

In various embodiments, the acid-switchable monomer 1012 is comprised of an acid-cleavable cyclic and branched aliphatic carbonyl, ester, oligomeric ester, ether, carbonate, or orthoester. In some preferred embodiments, the acid-switchable monomer 1012 is comprised of methyl cyclopentane, ethyl cyclopentane, or methyl adamantane. In some embodiments, the bonding material 410 may additionally comprise an organic-soluble monomer ($R_s$) 1016. The organic-soluble monomer 1016 is an organic compound such as an aliphatic compound, which enhances solubility of bonding material 410 in an organic solvent or a development solvent. In preferred embodiments it may be comprised of a C5-C20 alkyl group, a cycloalkyl group, a C5-C20 saturated or unsaturated hydrocarbon ring, or a C5-C20 heterocyclic group.

In this embodiment the bonding material 410 is mixed with an additive thermal acid generator (TAG). In some embodiments the thermal acid generator is bonded to the bonding material 410, while in others it is only blended with the bonding material 410. The thermal acid generator is not shown in FIG. 10. The thermal acid generator produces acid when baked at a high temperature, for example above 80 degrees Celsius.

Figure 11:
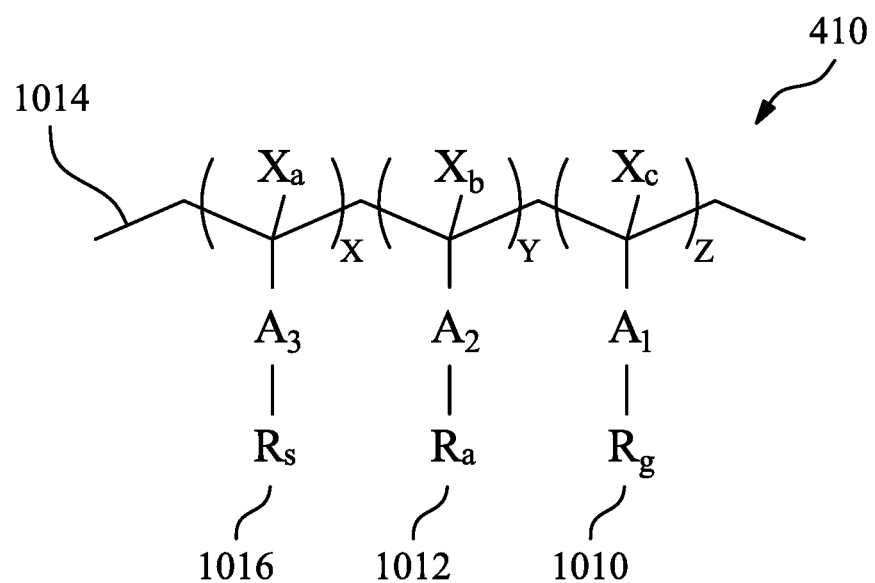

Referring now to FIG. 11, a specific example of the chemical structure of the bonding material 410 is illustrated. Grafting monomer 1010, acid-switchable monomer 1012 and organic-soluble monomer 1016 are bonded to $A_1$, $A_2$ and $A_3$, respectively, where each of $A_1$, $A_2$ and A3 may be COO— or PhO—. $A_1$, $A_2$ and A3 in turn are bonded to chemical backbone 1014 as part of chemicals X, Y and Z, respectively. The mole ratios of X to Y to Z are described by X+Y+Z=1.0, 1<X<0.9, 0.25<Y<0.5, and 0<Z<0.5. $X_a$, $X_b$ and X, may be hydrogen or methyl.

Figure 5:
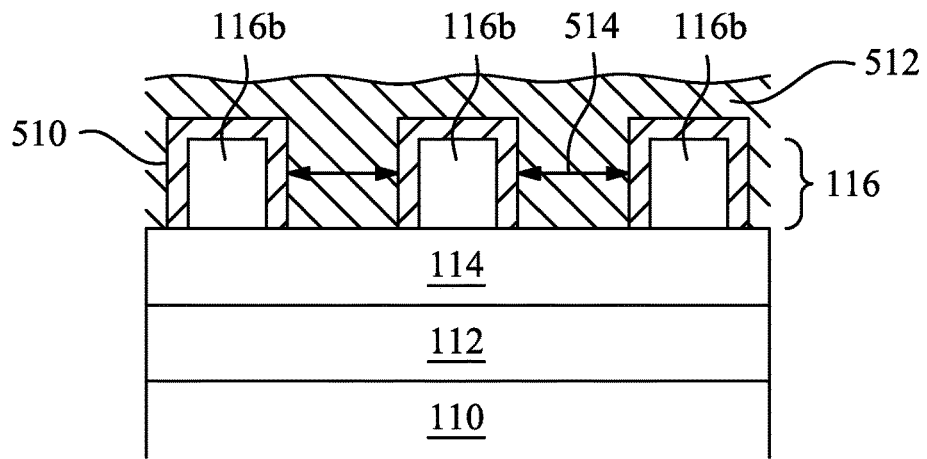

Referring now to block 1226 of FIG. 12 and to FIG. 5, a first baking process is performed. The first baking process may be a low temperature baking process, for example below 80 degrees Celsius. This first baking process causes the bonding material 410 and the additive thermal acid generator to react with the surface of the features 116b of the patterned photosensitive layer 116. In this reaction, the bonding material 410 bonds to the surface of the photosensitive layer 116, thereby thickening features 116b of the photosensitive layer 116 such that the distance between them is reduced, or shrunk, to a distance 514 that is less than distance 310. In some embodiments, features 116b will be thickened by 5-15 nm. As shown in block 1228 of FIG. 12, a developing process is then performed to remove unreacted bonding material 410 and unreacted thermal acid generator, leaving behind reacted bonding material and thermal acid generator layer 510.

After the developing process, if further increases to thickness of features 116b are desired, a second baking process is performed, as shown in block 1232 of FIG. 12. The second baking process may be performed at a higher temperature than the first baking process, for example at above 80 degrees Celsius. This second baking process causes the thermal acid generator of layer 510 to generate acid, and also creates new reaction sites in the reacted bonding material of layer 510 to allow further bonding with other bonding materials. This occurs because the second baking process causes the acid-switchable monomer 1012 to de-protect and become a reactive monomer which is catalyzed by the acid, facilitating reaction with other bonding materials.

If more thickness is desired, then the above process shown in FIGS. 4-5 may be repeated. In this case, referring back to block 1224 of FIG. 12 and to FIG. 5, the patterned photosensitive layer 116 is coated with a second bonding material 512. The second bonding material 512, like the first bonding material 410, may include a grafting monomer, an acid-switchable monomer, and/or an organic-soluble monomer, and may be mixed in a solution with a thermal acid generator. However, the grafting monomer and acid-switchable monomer may be different from those used in the first bonding material 410. Alternatively, the second bonding material 512 may be comprised of the same chemicals as the first bonding material 410.

Figure 6:
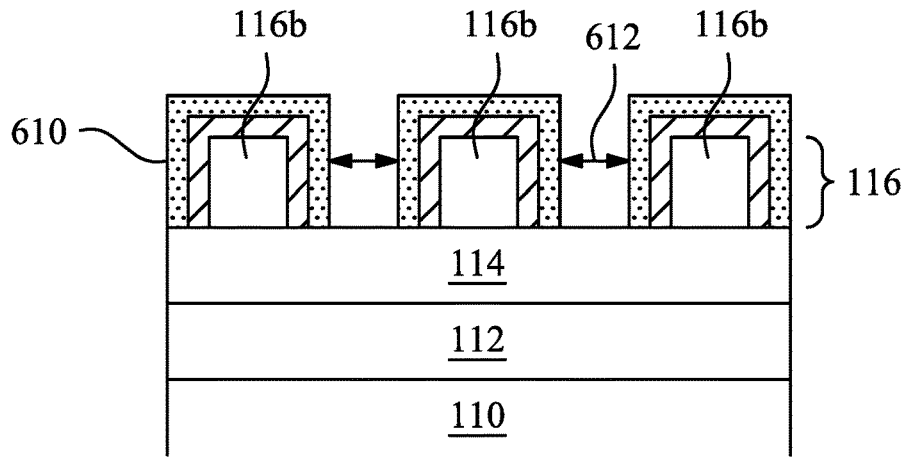

Referring now to block 1226 of FIG. 12 and to FIG. 6, a third baking process is performed. The third baking process is a low temperature baking process, similar to the first baking process. For example, the third baking process may be performed at below 80 degrees Celsius. This third baking process causes the second bonding material 512 to react with the reacted bonding material and thermal generator layer 510 on the surface of the features 116b of the patterned photosensitive layer 116, thereby thickening the features 116b. Referring to block 1228 of FIG. 12, a second developing process is then performed to remove unreacted bonding material 512 and unreacted thermal acid generator, leaving behind reacted bonding material and thermal acid generator layer 610. Referring to block 1232 of FIG. 12, if further increases in thickness of features 116b are desire, a fourth baking process is then performed at a higher temperature than the third baking process. For example, the fourth baking process may be performed at above 80 degrees Celsius. The fourth baking process, similar to the second baking process, causes the thermal acid generator of layer 610 to generate acid, and also creates new reaction sites on the reacted bonding material of layer 610. As described above with reference to the second baking process, this results in thickening of feature 116b of patterned photosensitive layer 116, and the distance between features 116b is shrunk to a distance 612 that is smaller than distance 514.

The distance between features 116b may be shrunk further by performing more cycles of coating with bonding material mixed with thermal acid generator, low temperature baking, developing, and high temperature baking until a desired critical dimension is achieved.

Figure 7:
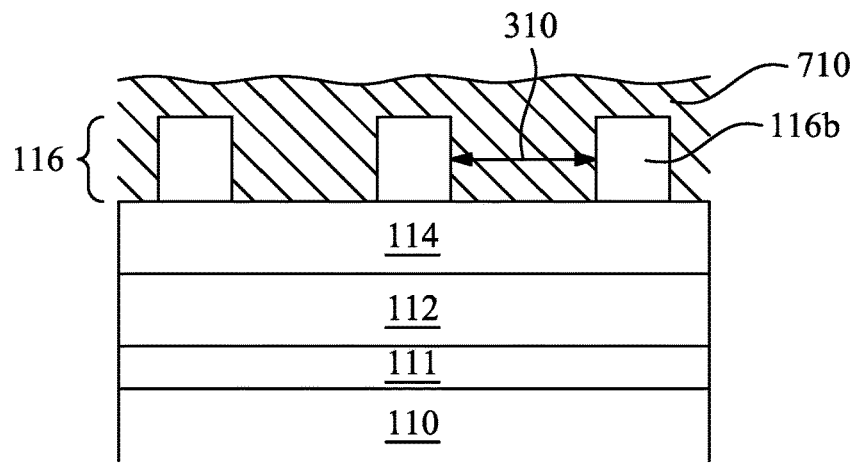
Figure 13:
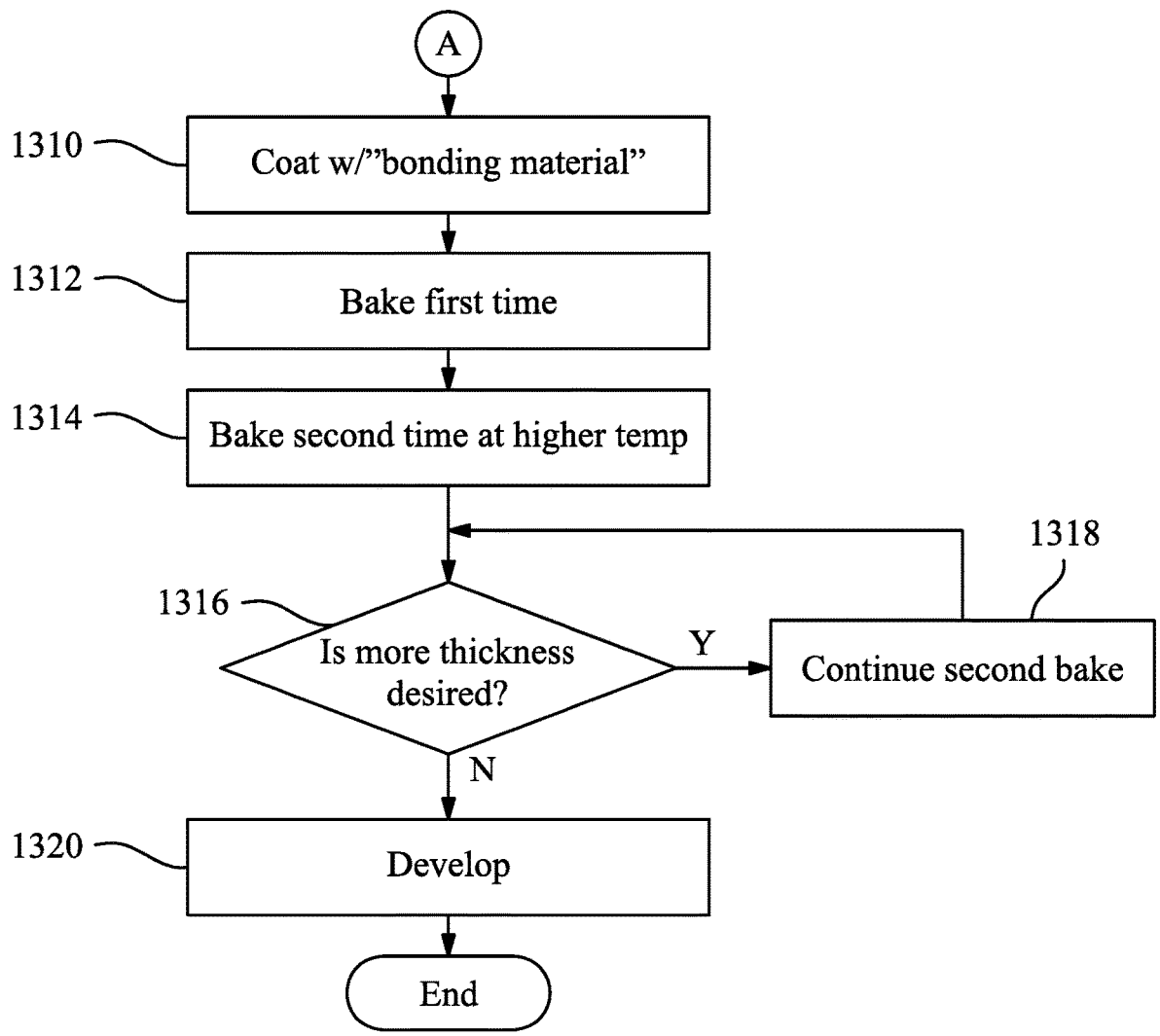
FIG. 13 is a flow diagram of a method of increasing thickness of patterned photoresist features, corresponding to FIGS. 7-8.

Referring now to FIG. 7 and to FIG. 13, there is illustrated an alternative embodiment of the above process of FIG. 4. In this embodiment the patterned photosensitive layer 116 is a negative-tone photosensitive layer and there is acid remaining in the features 116b from the development process of FIG. 3. Referring to block 1310 of FIG. 13, the patterned photosensitive layer 116 is coated with a bonding material 710, which is similar to the bonding material 410 as described in FIG. 10. The bonding material 710 is comprised of a grafting monomer ($R_g$) 1010 and an acid-switchable monomer ($R_a$) 1012 bonded to a chemical backbone 1014. However, in this embodiment, bonding material 710 is not mixed in a solution with a thermal acid generator, as there is already acid present in the features 116b.

Figure 8:
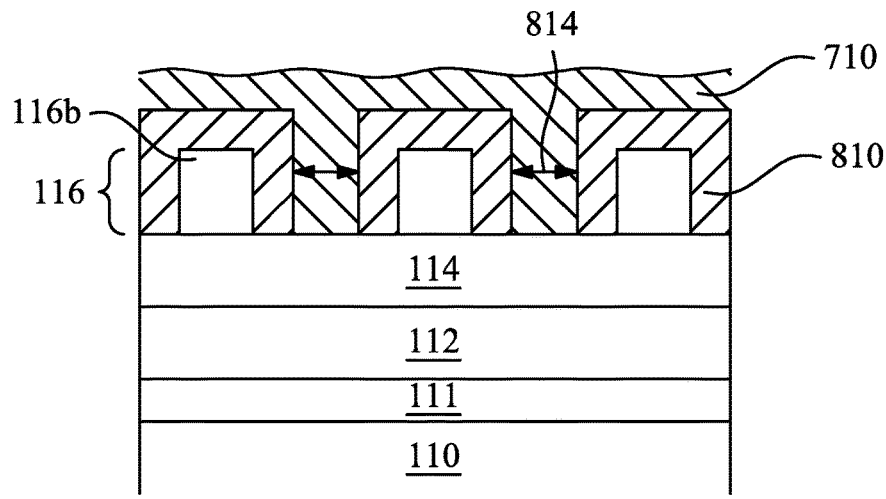

Referring now to block 1312 of FIG. 13 and to FIG. 8, a first baking process may be performed. The first baking process is a low temperature baking process, for example below 80 degrees Celsius. This first baking process causes the bonding material 710 and the acid present in the features 116b to react with the surface of the features 116b of the patterned photosensitive layer 116, forming reacted bonding material layer 810, and thereby thickening features 116b of photosensitive layer 116. Referring to block 1314 of FIG. 13, a second baking process is then performed at a higher temperature, for example above 80 degrees Celsius. The second baking process creates new reaction sites on the reacted bonding material layer 810. In some embodiments, the first baking process is optional, and the second baking process may cause both the reaction and conversion described above.

The second baking process additionally causes acid present in the features 116b to diffuse to the surface of the reacted bonding material layer 810 and react with the bonding material 710 which is still coating the reacted bonding material layer 810. This further thickens reacted bonding material layer 810, and thereby further thickened features 116b of photosensitive layer 116. The second baking process may be continued to create new reaction sites on the reacted bonding material layer 810, as described above, thereby allowing further thickening features 116b of the patterned photosensitive layer 116 by allowing further reaction with bonding material 710.

As long as the second baking process continues and there is acid and bonding material 710 left to react with, the features 116b will continue to be thickened. Once the distance 814 between features 116b is shrunk a desired amount, the second baking process may be terminated. Referring to block 1320 of FIG. 13, a developing process is then performed to remove any unreacted bonding material 710.

Figure 9:
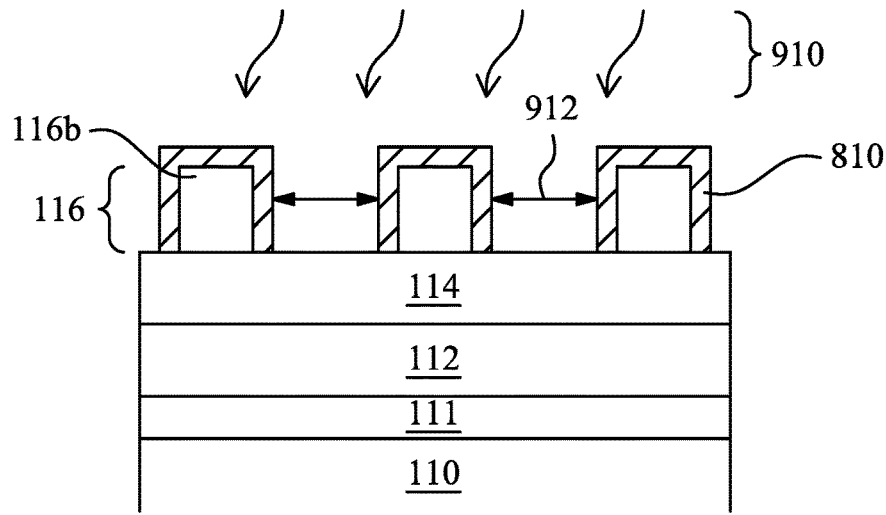
Figure 14:
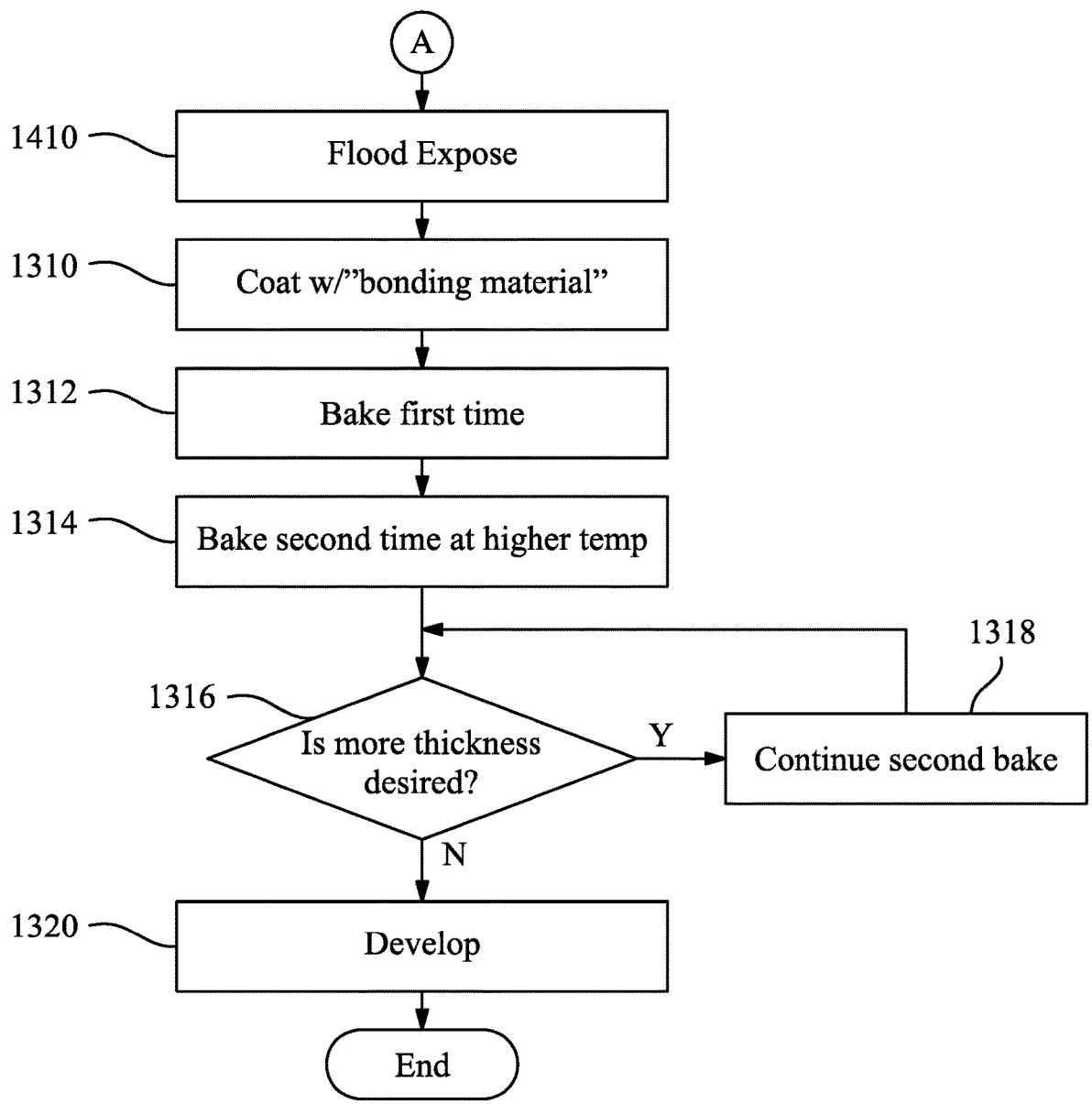
FIG. 14 is a flow diagram of a method of increasing thickness of patterned photoresist features, corresponding to FIG. 9.

Referring now to FIG. 9 and to FIG. 14, there is illustrated an alternative embodiment of the above process of FIG. 7. In this embodiment the patterned photosensitive layer 116 is a positive-tone photosensitive layer. Referring to block 1410, a flood exposure process 910 is performed on the entire surface of the patterned photosensitive layer 116. In the flood exposure process 910, the entire photosensitive layer 116 is exposed to radiation energy, i.e. no photomask is used. As a result, the entire photosensitive layer 116 is exposed. The flood exposure process 910 causes acid to be generated from the positive-tone photosensitive material of the patterned photosensitive layer 116. Once acid is present, the processes of FIGS. 7 and 8 can be performed to obtain the result of a decrease in critical dimension, i.e. a shrinking of distance 310 between features 116b.

Specifically, the patterned photosensitive layer 116 may be coated with a bonding material 710 which is not mixed with a thermal acid generator, as shown in block 1310 of FIG. 14. Then, as shown in block 1312 of FIG. 14, an optional first baking process can be performed to react the bonding material 710 with the surface of features 116b of the patterned photosensitive layer 116, creating reacted bonding material layer 810, thereby thickening the features 116b of patterned photosensitive layer 116 and shrinking the distance 912. Next, as shown in block 1314 of FIG. 14, a second, high temperature, baking process is performed to create new reaction sites on reacted bonding material layer 810. The second, high temperature, baking process may be performed at, for example, above 80 degrees Celsius. The second baking process additionally diffuses acid to the surface of the reacted bonding material layer 810, and causes the bonding material 710 to react with the surface of the reacted bonding material layer 810. As the second baking process continues this cycle continues, resulting in a continually thickening reacted bonding material layer 810 and therefore continually thickening features 116b. Once the distance 912 between features 116b has been shrunk to a desired distance, the second, high temperature, baking process may be ceased. Finally, as shown in block 1320 of FIG. 14, a developing process is performed to remove any unreacted bonding material 710 that remains.

Referring now to FIG. 12, a flow diagram is shown which illustrates a method of increasing thickness of patterned photoresist features corresponding to FIGS. 1-6. Beginning at block 1210, a substrate 110 is received. Moving to block 1212, the substrate 110 is coated with a photoresist. Moving to block 1214, a soft baking process is performed on the photoresist, forming photosensitive layer 116 of FIG. 1. In some embodiments, blocks 1212 and 1214 may be repeated to form multiple layers, such as under layer 112 and middle layer 114 of FIG. 1. Moving to block 1216, the photosensitive layer 116 is exposed through a patterned mask. Moving to block 1218, a post-exposure baking (PEB) process is performed on the exposed photoresist. This results in the structure of FIG. 2. Moving to block 1220, the exposed photosensitive layer 116 is developed. Moving to block 1222, the developed photosensitive layer 116 is hot baked. This results in the patterned photosensitive layer 116 of FIG. 3.

Moving to block 1224, the patterned photosensitive layer 116 is coated with a bonding material 410 mixed with a thermal acid generator. The bonding material 410 is described above with reference to FIGS. 10 and 11. Moving to block 1226, a first baking process is performed at a low temperature, for example below 80 degrees Celsius. As described above with reference to FIG. 5, this first baking process causes the bonding material 410 and the additive thermal acid generator to react with the surface of the features 116b of the patterned photosensitive layer 116, thus thickening features 116b of photosensitive layer 116 such that the distance between them is shrunk to distance 514.

Moving to block 1228, a developing process is performed to remove unreacted bonding material 410 and unreacted thermal acid generator, leaving behind reacted bonding material and thermal acid generator layer 510, as described above with reference to FIG. 5.

Moving to decision block 1230, if features 116b are not thick enough (e.g., if the distance 514 between features 116b is not small enough), then the method progresses to block 1232.

Moving to block 1232, if more thickness of features 116b is desired, a second baking process is performed at a high temperature, for example at above 80 degrees Celsius. As described above with reference to FIG. 5, the second baking process causes the thermal acid generator of layer 510 to generate acid, and also creates new reaction sites on the reacted bonding material of layer 510, allowing for reaction with more bonding material. From here, blocks 1224-1230 may be repeated as many times as needed to reach the desired thickness, as described above with reference to FIG. 6. The same bonding material may be used in each repetition, or a different bonding material (e.g., a bonding material comprised of a different grafting monomer or acid-switchable monomer) may be used.

Referring now to FIG. 13, a flow diagram is shown which illustrates a method of increasing thickness of patterned photoresist features corresponding to FIGS. 7-8. The process begins at block A of FIG. 12, after the patterned photosensitive layer 116 of FIG. 3 has been formed. In this embodiment, the photosensitive layer 116 is a negative-tone photoresist and there is acid remaining in features 116b after their formation.

Moving to block 1310, the patterned photosensitive layer 116 is coated with bonding material 710. The bonding material 710 is described above with reference to FIGS. 10 and 11. In this embodiment no thermal acid generator is mixed with the bonding material 710. Moving to block 1312, an optional first baking process is performed, as described above with reference to FIG. 8. This first baking process is a low temperature baking process, for example below 80 degrees Celsius, and it causes the bonding material 710 and the acid present in the features 116b to react with the surface of the features 116b of the patterned photosensitive layer 116, forming reacted bonding material layer 810, thereby thickening features 116b of the patterned photosensitive layer 116, e.g. shrinking distance 814 between features 116b.

Moving to block 1314, a second baking process is performed at a high temperature, for example above 80 degrees Celsius. As described above with reference to FIG. 8, the second baking process creates new reaction sites on the reacted bonding material layer 810, allowing for further reaction with bonding materials . . . . The second baking process additionally causes acid present in the features 116b to diffuse through the newly converted bonding material layer 810 and react with the bonding material 710 which is still coating the patterned photosensitive layer 116.

Moving to decision block 1316, if thicker features 116b are desired, which is to say if distance 814 is not small enough, then the process proceeds to block 1318 and the second baking process is continued. Continuing the second baking process continues the cycle of creating reaction sites on bonding material layer 810, diffusing acid to the surface of the bonding material layer 810, and reacting more bonding material 710 with the surface of the bonding material layer 810, thereby thickening bonding material layer 810 and accordingly thickening features 116b.

Once the thickness of features 116b reaches a desired thickness, which is to say once distance 814 between features 116b is shrunk a desired amount, the process moves to block 1320, and a developing process is performed to remove any unreacted bonding material 710.

Referring now to FIG. 14, a flow diagram is shown which illustrates a method of increasing thickness of patterned photoresist features corresponding to FIG. 9. The process begins at block A of FIG. 12, after the patterned photosensitive layer 116 of FIG. 3 has been formed. In this embodiment, the photosensitive layer 116 is a positive-tone photoresist.

Moving to block 1410, a flood exposure process 910 is performed on the entire surface of the patterned photosensitive layer 116. As described above with reference to FIG. 9, the flood exposure process 910 causes acid to be generated from the positive-tone photoresist material of the patterned photosensitive layer 116. Once acid is present, the process of blocks 1310-1320 of FIG. 13 (which describes FIGS. 7-8) may be applied with the end result of shrinking distance 912 between features 116b by a desired amount.

The present disclosure provides a method for shrinking the distance between features in a photosensitive layer, i.e. shrinking the critical dimension of the photosensitive layer. By coating the photosensitive layer with a bonding material comprised of a grafting monomer as well as an acid-switchable monomer and baking in the presence of acid, the photosensitive layer may be shrunk by any desired amount, i.e. the distance between the photoresist features may be reduced by any desired amount. In various embodiments, the acid-switchable monomer is an acid-labile group that de-protects when baked at a temperature of over 80 degrees Celsius. In some embodiments, a low temperature baking process may additionally be used to cause the bonding material to react with the photosensitive layer, while in other embodiments the high temperature baking process performs this function.

In various embodiments, a thermal acid generator may be mixed with the bonding material to generate acid during the baking process, which in turn helps the bonding material to react with the photosensitive material. In other embodiments in which the photosensitive material is a negative-tone photoresist, enough acid may remain in the photosensitive layer after its formation for the bonding material to react with the photosensitive material. In other embodiments in which the photosensitive material is a positive-tone photoresist, an additional flood exposure process may be used to generate acid in the photosensitive material, which then facilitates reaction between the bonding material and the photosensitive material during baking.

A lithography method is provided in accordance with some embodiments. The lithography method includes forming a patterned photoresist on a material layer, applying a first bonding material to a side surface of the patterned photoresist, performing a treatment on the first bonding material to bond the first bonding material to the side surface of the patterned photoresist, wherein the treatment creates a bonding site on the first bonding material configured to bond to a second bonding material, applying the second bonding material to a side surface of the first bonding material, and patterning the material layer by selectively processing a portion of the material layer exposed by the patterned photoresist, the first bonding material, and the second bonding material.

A lithography method is provided in accordance with some embodiments. The lithography method includes forming a patterned photoresist on a material layer, wherein the patterned photoresist contains acid, applying a bonding material to a surface of the patterned photoresist, and performing a baking process on the bonding material, wherein: the baking process causes the bonding material to bond to the surface of the patterned photoresist, thereby creating a structure over the patterned photoresist, the baking process causes the acid to diffuse to the surface of the structure, and the baking process causes the acid to react with the bonding material to create a bonding site on the structure, the bonding site being configured to bond to the bonding material.

A lithography method is provided in accordance with some embodiments. The lithography method includes forming a patterned photoresist on a material layer, performing a flood exposure process on the patterned photoresist to generate acid, applying a bonding material to a surface of the patterned photoresist, and performing a baking process on the bonding material, wherein: the baking process causes the bonding material to bond to the surface of the patterned photoresist, thereby creating a structure over the patterned photoresist, the baking process causes the acid to diffuse to the surface of the structure, and the baking process causes the acid to react with the bonding material to create a bonding site on the structure, the bonding site being configured to bond to the bonding material.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method comprising:
   forming a patterned mask layer on a material layer;
   applying a first material layer on the patterned mask layer;
   performing a first baking process on the first material layer at a first temperature;

after the first baking process, performing a second baking process on the first material layer at a second temperature;

determining if a first thickness of the first material layer needs to be increased;

if the first thickness needs to be increased, then continuing the second baking process;

after the first and second baking processes, developing the first material layer; and thereafter, patterning the material layer using the patterned mask layer and the first material layer.

2. The method of claim 1, wherein the second temperature is higher than the first temperature.

3. The method of claim 2, wherein the first temperature is sufficient to cause the first material layer to bond with the patterned mask layer; and where the second temperature is sufficient to create new reaction sites on the first material layer.

4. The method of claim 1, wherein:
the patterned mask layer is a positive-tone photosensitive layer; and
the method further comprises performing a flood exposure process on the patterned mask layer prior to the applying of the first material layer.

5. The method of claim 4, wherein the flood exposure process is configured to cause the patterned mask layer to generate an acid that promotes bonding with the first material layer.

6. The method of claim 1, wherein:
the patterned mask layer includes an acid; and
the second baking process is configured to cause diffusion of the acid into the first material layer.

7. The method of claim 1, wherein the first material layer includes an acid-switchable monomer.

8. The method of claim 7, wherein the second baking process is configured to deprotect the acid-switchable monomer such that the acid-switchable monomer provides a reaction site.

9. A method comprising:
receiving a substrate having a layer disposed thereupon;
forming a patterned photomask on the layer, wherein the patterned photomask has a top surface and a side surface extending from the top surface to the layer;
forming a bonding material on the top surface and the side surface of the patterned photomask;
performing a first baking process on the substrate such that a first portion of the bonding material bonds with the top surface and the side surface of the patterned photomask;
performing a second baking process on the substrate such that a second portion of the bonding material bonds with the first portion;
removing an unreacted portion of the bonding material such that a reacted portion of the bonding material that includes the first portion and the second portion remains; and
patterning the layer based on the patterned photomask and the reacted portion of the bonding material.

10. The method of claim 9, wherein a thickness of the reacted portion of the bonding material depends on a duration of the second baking process.

11. The method of claim 9, wherein the first baking process is performed at a lower temperature than the second baking process.

12. The method of claim 9, wherein:
the patterned photomask includes an acid; and
the second baking process is configured to cause diffusion of the acid into the bonding material.

13. The method of claim 12 further comprising performing a flood exposure on the patterned photomask to produce the acid prior to the forming of the bonding material.

14. The method of claim 9, wherein the bonding material includes an acid-switchable monomer.

15. The method of claim 14, wherein the second baking process is configured to deprotect the acid-switchable monomer such that the acid-switchable monomer provides a reaction site.

16. A method comprising:
forming a patterned photoresist on a material layer, wherein the patterned photoresist contains an acid;
applying a bonding material to a surface of the patterned photoresist; and
performing a first baking process on the bonding material such that a first portion of the bonding material bonds to the surface of the patterned photoresist;
performing a second baking process on the bonding material such that the acid diffuses to the first portion of the bonding material and such that a second portion of the bonding material bonds to the first portion;
removing an unreacted portion of the bonding material; and
patterning a portion of the material layer exposed by the patterned photoresist and the first portion and the second portion of the bonding material.

17. The method of claim 16, wherein the bonding material includes an acid-switchable monomer.

18. The method of claim 17, wherein the acid-switchable monomer includes at least one of: methyl cyclopentane, ethyl cyclopentane, or methyl adamantane.

19. The method of claim 17, wherein the second baking process is configured to deprotect the acid-switchable monomer to provide a reaction site.

20. The method of claim 16, wherein a thickness of the second portion is based on a duration of the second baking process.

* * * * *